United States Patent
Furuchi

[19]

[11] Patent Number: 6,121,813
[45] Date of Patent: Sep. 19, 2000

[54] DELAY CIRCUIT HAVING A NOISE REDUCING FUNCTION

[75] Inventor: Masaki Furuchi, Tokyo, Japan

[73] Assignee: NEC Corporation, Tokyo, Japan

[21] Appl. No.: 09/019,727

[22] Filed: Feb. 6, 1998

[30] Foreign Application Priority Data

Feb. 6, 1997 [JP] Japan .................................. 9-023590

[51] Int. Cl.⁷ .................................................. H03H 11/26
[52] U.S. Cl. .......................... 327/285; 327/288; 327/278
[58] Field of Search .................................. 327/262, 263, 327/264, 276, 278, 287, 288, 285

[56] References Cited

U.S. PATENT DOCUMENTS

| | | | |
|---|---|---|---|
| 3,869,676 | 3/1975 | Harrison et al. | 329/204 |
| 4,651,270 | 3/1987 | Edwards | 363/96 |
| 4,716,319 | 12/1987 | Rebeschini | 327/554 |
| 5,055,706 | 10/1991 | Nakai et al. | 327/288 |
| 5,097,159 | 3/1992 | Seki et al. | 327/263 |
| 5,180,938 | 1/1993 | Sin | 327/288 |
| 5,352,945 | 10/1994 | Casper et al. | 327/262 |
| 5,459,424 | 10/1995 | Hattori | 327/278 |
| 5,589,790 | 12/1996 | Allen | 327/333 |
| 5,796,296 | 8/1998 | Krzentz | 327/545 |

FOREIGN PATENT DOCUMENTS

| | | |
|---|---|---|
| 0 330 405 | 8/1989 | European Pat. Off. . |
| 0 589 763 | 3/1994 | European Pat. Off. . |
| 64-51716 | 2/1989 | Japan . |
| 2-192 | 1/1990 | Japan . |
| 3-23709 | 1/1991 | Japan . |
| 4-78220 | 3/1992 | Japan . |
| 5-48433 | 6/1993 | Japan . |
| 89-12020 | 7/1989 | Rep. of Korea . |
| 93-18810 | 6/2000 | Rep. of Korea . |

*Primary Examiner*—Timothy P. Callahan
*Assistant Examiner*—Hai L. Nguyen
*Attorney, Agent, or Firm*—Sughrue, Mion, Zinn, Macpeak & Seas, PLLC

[57] ABSTRACT

A delay circuit which resists noise present in the power supply or ground includes a waveform modification circuit for varying the rise and fall of inputted pulse signals, and a switch for connecting a power supply and an output terminal when the voltage of the modified waveform exceeds the threshold value related to the power supply voltage. The waveform modification circuit includes a voltage control circuit for varying the output voltage of the waveform modification circuit in accordance with changes in the voltage of the power supply. To reshape a waveform, an input signal is compared with the power supply voltage as a reference value, and the input signal and power supply voltage are switched in accordance with the comparison results. The voltage control circuit changes the output of the waveform modification circuit in accordance with the changes in the reference when noise contained in the power supply voltage is applied to the output of the waveform modification circuit. No malfunctions thus occur when an input signal is compared with the power supply voltage as a reference value in order to reshape a waveform.

3 Claims, 7 Drawing Sheets

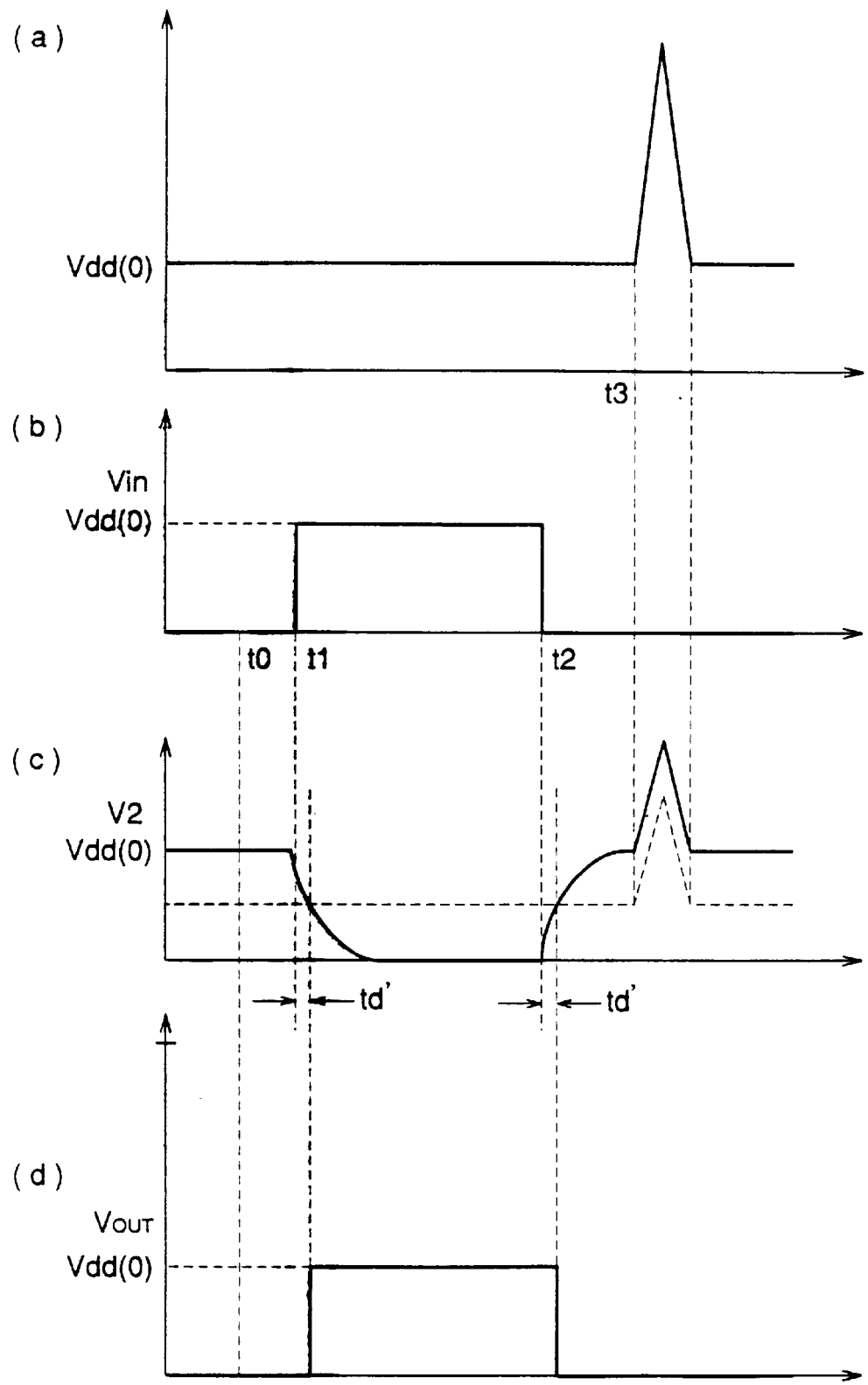
F I G . 4

F I G. 5
(a)
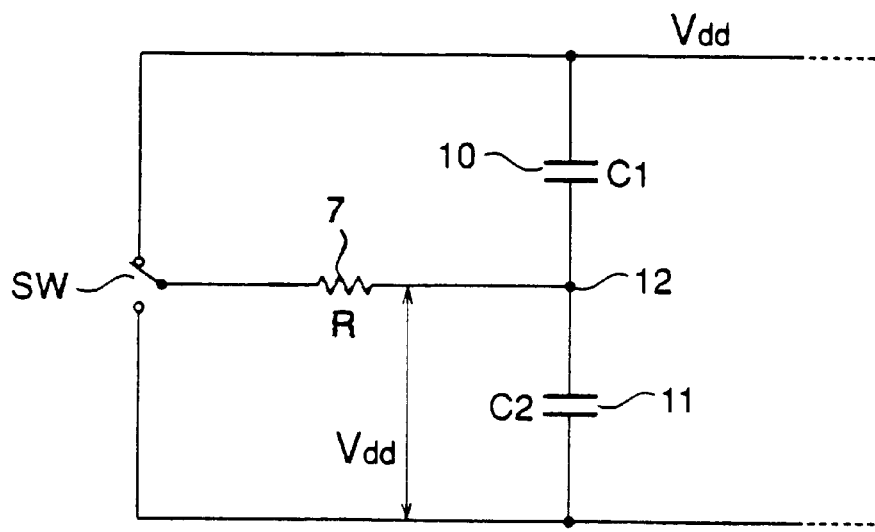
(b)
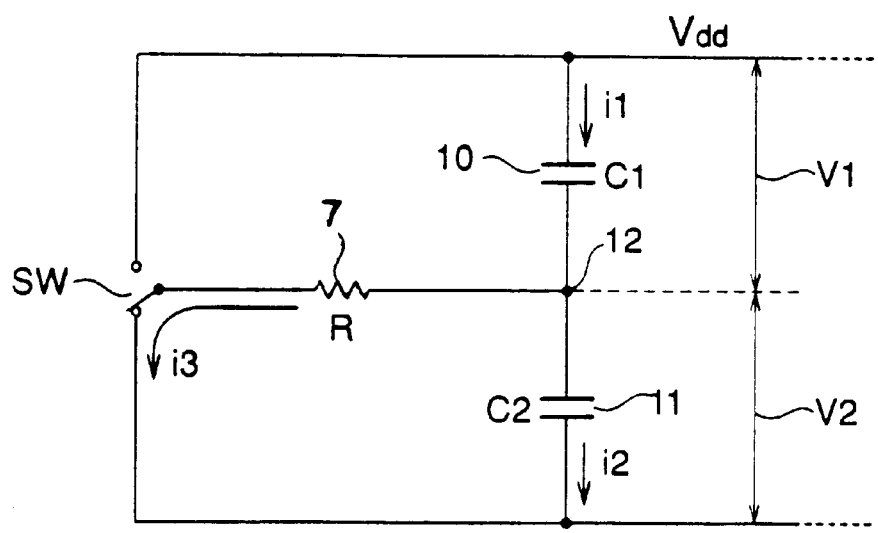

F I G. 6
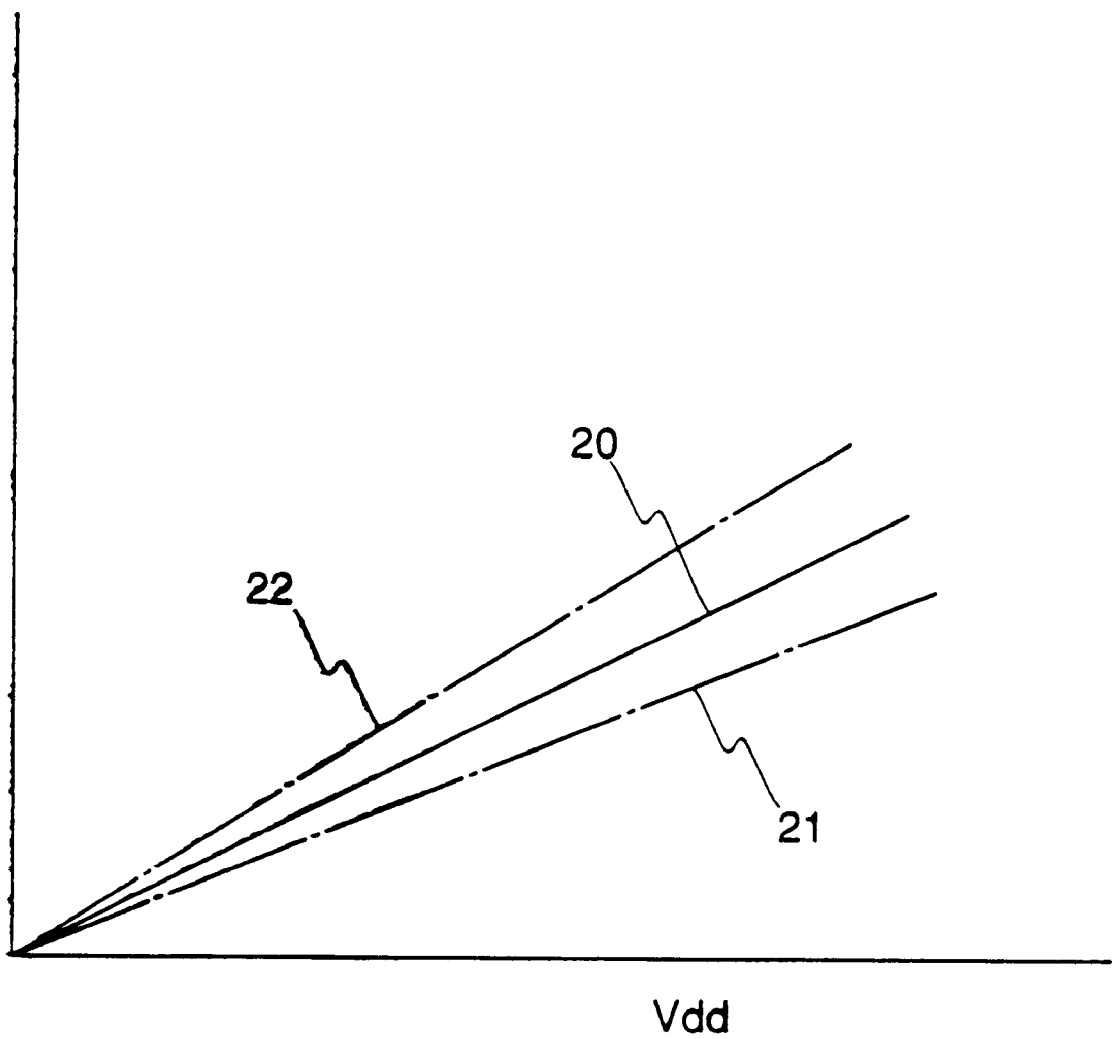
Vdd

DELAY CIRCUIT HAVING A NOISE REDUCING FUNCTION

BACKGROUND OF THE INVENTION

The present invention relates to a digital circuit, and more particularly to a digital circuit in which the effect of power supply noise is reduced.

Delay circuits in which the charge/discharge time is utilized using inverters, resistors, and capacitors to obtain arbitrary delay signals are widely used in digital circuits.

As shown in FIG. 7, a conventional delay circuit comprises an inverter 101 having a p-channel transistor 3 and an n-channel transistor 4, an inverter 102 having a p-channel transistor 5 and an n-channel transistor 6, a resistor 7 connected between the output terminal of the inverter 101 and the input terminal of the inverter 102, a capacitor 8 inserted between ground and a terminal of the resistor 7, an input terminal 1 connected to the gate of the inverter 101, and an output terminal 2 for retrieving the output signals of the inverter 102.

The resistor 7 and the capacitor 8 constitute an integrating circuit 103. In addition, the sources of the p-channel transistors 3 and 5 are connected to a power supply Vdd, and the sources of the n-channel transistors 4 and 6 are both connected to ground.

As is commonly known, an input signal Vin presented to the input terminal 1 is inverted and outputted by the inverter 101. The inverted and outputted signal is integrated by the integrating circuit 103, and its waveform is smoothed. The waveform is reshaped by inputting the modified signal to the inverter 102. The inverter 102 presents the output terminal 2 with an output signal Vout having the same phase as the input signal Vin, which is delayed by td in relation to the input signal.

The operation of the delay circuit shown in FIG. 7 will now be described in detail with reference to the signal waveform diagram depicted in FIG. 8.

It is assumed that the input signal Vin is at ground level at time t0 in FIG. 8b. In this case, the p-channel transistor 3 is on, and the integrating circuit 103 is charged by the power supply via the p-channel transistor 3. For this reason, the signal v1 of the output end 9 of the integrating circuit 103 assumes a power supply voltage Vdd(0), as shown in FIG. 8c. Consequently, the n-channel transistor 6 is switched on, and the output signal Vout reaches ground level, as shown in FIG. 8d.

When the input signal Vin subsequently rises from ground level to the power supply voltage Vdd(0) at time t1 shown in FIG. 8b, the p-channel transistor 3 is switched off, and the n-channel transistor 4 is switched on. For this reason, the charge accumulated on the capacitor 8 is drained to ground via the resistor 7 and n-channel transistor 4. Assuming that the "on" resistance of the n-channel transistor 4 is sufficiently low in relation to the resistance R of the resistor 7 and can thus be ignored, the following calculation can be made.

$$v1 = Vdd(0) \cdot \exp(-t/CR) \quad (1)$$

where C is the capacitance of the capacitor 8, and t is time.

If it is assumed that the threshold value of the inverter 102 is $Vdd(0)/2$, the time td required for the output signal Vout to change from ground level to the power supply voltage Vdd(0) can be calculated using Equation 1, and Equation 2 below can be used if $v1 = Vdd(0)/2$.

$$td = CR \cdot \ln 2 \quad (2)$$

Specifically, the inverter 102 performs inversion and the output signal Vout assumes the power supply voltage Vdd(0), as shown in FIG. 8d, when a delay time td elapses following time t1, and the signal v1 decreases from the power supply voltage Vdd(0) to Vdd(0)/2, as shown in FIG. 8c.

Similarly, the output signal Vout lags behind the input signal Vin by the delay time td calculated based on Equation 2, and decreases as shown in FIG. 8d when the input signal Vin drops from the power supply voltage Vdd(0) to ground level at the time t2 shown in FIG. 8b. Consequently, the CR value for obtaining the necessary delay time td in the delay circuit shown in FIG. 7 can be calculated using Equation 2.

The operation of a delay circuit will now be described for a case in which noise is superposed on a power supply.

Let us now assume that spike noise lasting several nanoseconds to several tens of nanoseconds is superposed on the power supply at time t3 in FIG. 8a. Since the time constant of the integrating circuit 103 is much greater than the duration of the spike noise, the integrating circuit 103 does not respond to the spike noise, and the signal v1 retains the power supply voltage Vdd unchanged beyond time t3, as shown in FIG. 8c.

On the other hand, the sources of the p-channel transistor and n-channel transistor are connected to the power supply and to ground, respectively, and the inverter 102 has a high response speed, responding to the spike noise and allowing the threshold value to change at a fast pace together with changes in the power supply voltage.

Consequently, the threshold value of the inverter 102 reaches Vdd(0) at time t4 once the power supply voltage reaches 2Vdd(0) at time t4 in FIG. 8a, and the power supply voltage Vdd(0), intended to serve as a high level for the inverter 102, becomes a low level, whereby the inverter 102 outputs a high level corresponding to the power supply voltage instead of outputting the expected ground level, and a malfunction occurs.

Since the conventional delay circuit described above is such that a single electrode whose capacity determines the delay time is connected either to the ground level or to the power supply level, the time constant determined by CR slowly changes the output signal of the integrating circuit composed of capacitors and resistors in proportion to spike noise.

On the other hand, the threshold value of an inverter changes instantaneously, so the threshold value of the inverter presented with the output of the integrating circuit increases rapidly when noise is superposed on the power supply.

For this reason, a drawback of prior art is that the voltage outputted by the integrating circuit and intended to serve as a high level for the inverter becomes a low level, and the output of the delay circuit instantaneously rises to a high level that follows the power supply voltage, causing a malfunction.

Malfunctions based on such changes in the power supply voltage commonly occur not only in delay circuits but also in digital circuits.

SUMMARY OF THE INVENTION

An object of the present invention is to provide a digital circuit that is connected to ground and to a power supply and that does not malfunction when noise is superposed.

Another object of the present invention is to provide a delay circuit in which the desired delay time can be set without increasing the surface area of the layout.

In view of this, the digital circuit pertaining to the present invention comprises a waveform modification circuit for varying the rise and fall of inputted pulse signals, a switch for connecting a power supply and an output terminal when the voltage of the modified waveform exceeds the threshold value related to the power supply voltage, and a voltage control circuit for varying the output voltage of the aforementioned waveform modification circuit in accordance with the changes in the voltage of the power supply. To reshape a waveform, an input signal is compared with the power supply voltage as reference value, and the input signal and power supply voltage are switched in accordance with the comparison results. If noise is applied to the power supply voltage at this time, the comparison reference is changed, applying an unneeded pulse signal or eliminating a needed pulse signal. By contrast, the voltage control circuit changes the output of the waveform modification circuit in accordance with changes in the reference when noise contained in the power supply voltage is applied to the output of the waveform modification circuit. No malfunctions thus occur when an input signal is compared with the power supply voltage as a reference value in order to reshape a waveform.

A delay circuit having an integrating circuit may be used as such a digital circuit. The delay circuit pertaining to the present invention is a delay circuit for delaying inputted pulse signals, comprising a resistor for receiving a pulse signal, a first capacitor connected in series to this resistor, a second capacitor in which one end is connected in parallel to the first capacitor and the other end is connected to the power supply voltage corresponding to the high level of the aforementioned pulse signal, and a switch having an output terminal that is connected to the connection point of the first capacitor and the aforementioned second capacitor.

In this case, the switch connects the aforementioned power supply to the output terminal when the signal received from the aforementioned connection point exceeds a predetermined threshold value, and connects the aforementioned connection point to the output terminal when the signal received from the aforementioned connection point falls below the predetermined threshold value.

In this case, a capacitor is adopted as the aforementioned voltage control circuit. The noise of the power supply voltage can thus be applied to the output of an RC circuit (integrating circuit) and outputted. Because the threshold value of the switch still varies with changes in the power supply voltage, simultaneous variations in the input signal and the reference value prevent malfunctions from occurring when the noise of the power supply voltage is applied to the output of the integrating circuit due to the presence of the second capacitor. In addition, the surface area of the layout does not increase because the arrangement merely involves connecting the capacitors and the power supply. The product is suitable for use as a semiconductor integrated circuit when the switch is composed of CMOS transistors.

In addition, the time constant of the integrating circuit is determined by the capacitance of the capacitors. The delay time is determined by this time constant and by the threshold value of the switch. In order to set the capacitance of the capacitors with the aim of assigning a specific delay time, the capacity previously realized by a single conventional capacitance can be obtained as a sum of capacitances of the aforementioned first and second capacitors. In other words, the sum of capacitances is set such that it is equal to the capacitance obtained when the time constant of an integrating circuit determined in conjunction with the threshold value of a CMOS transistor is realized with a single capacitor.

Ratios are selected such that the threshold value of the switch in which the constant a is 1 or greater is set to the value "power supply voltage/a," and the capacity ratio of the first capacitor and the aforementioned second capacitor is set to the value "a−1." The output of the integrating circuit and the threshold value of the switch are thus equal to each other. For example, the capacitances of the first and second capacitors are equal to each other if the threshold value is half the power supply voltage.

Another feature is that the conventional digital circuit in which the capacitor determining the delay time is connected solely to ground is changed to an arrangement in which the capacitor is divided into a plurality of capacitors without changing the overall capacity value, some of the divided capacitors are connected to ground, and the remaining capacitors are connected to a power supply, resulting in a delay time that is equal to the delay time of the conventional delay circuit and preventing malfunctions from occurring even when noise is superposed on ground and on the power supply without increasing the surface area of the layout.

BRIEF DESCRIPTION OF THE DRAWINGS

FIGS. 4a–4d are signal waveform diagrams illustrating the operation of the delay circuit;

FIGS. 5a and 5b are equivalent circuit diagrams of the integrating circuit;

FIG. 6 is a diagram depicting the manner in which the threshold value of the inverter 102 and the output voltage of an integrating circuit 104 depend on the power supply voltage;

DETAILED DESCRIPTION OF THE PREFERRED EMBODIMENTS

Figure 1:
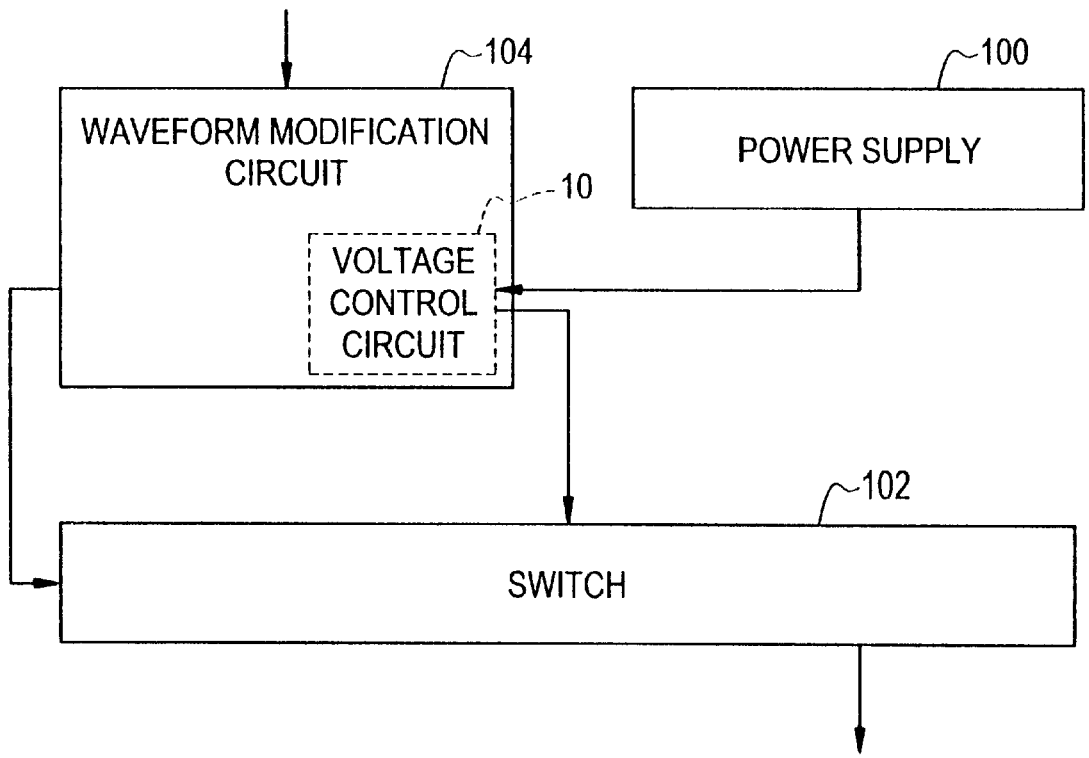
FIG. 1 is a block diagram depicting the structure of an embodiment of the present invention.

Embodiments of the present invention will now be described with reference to the drawings. The digital circuit depicted in FIG. 1 comprises a waveform modification circuit for varying the rise and fall of an inputted pulse signal, a switch for connecting a power supply and an output terminal when the voltage of the modified waveform exceeds the threshold value related to the power supply voltage and for disconnecting the aforementioned power supply and the output terminal when the threshold value is not exceeded. The waveform modification circuit includes a voltage control circuit for varying the output voltage of the aforementioned waveform modification circuit in accordance with the changes in the voltage of the power supply. The application of the varying power supply voltage to the output of the waveform modification circuit by the voltage control circuit prevents malfunctions from occurring even when the threshold value of the switch varies in accordance with the variations in the power supply voltage.

It is preferable for a capacitor connected to the line of the aforementioned power supply and to the output line of the aforementioned waveform modification circuit to be used as the voltage control circuit. The capacity of the charge provided to the capacitor constitutes a predetermined capacity related to the ratio of the threshold value and the power supply voltage of the aforementioned switch. Specifically, the capacitance of this capacitor varies with changes in the ratio of threshold value to power supply voltage.

Figure 2:
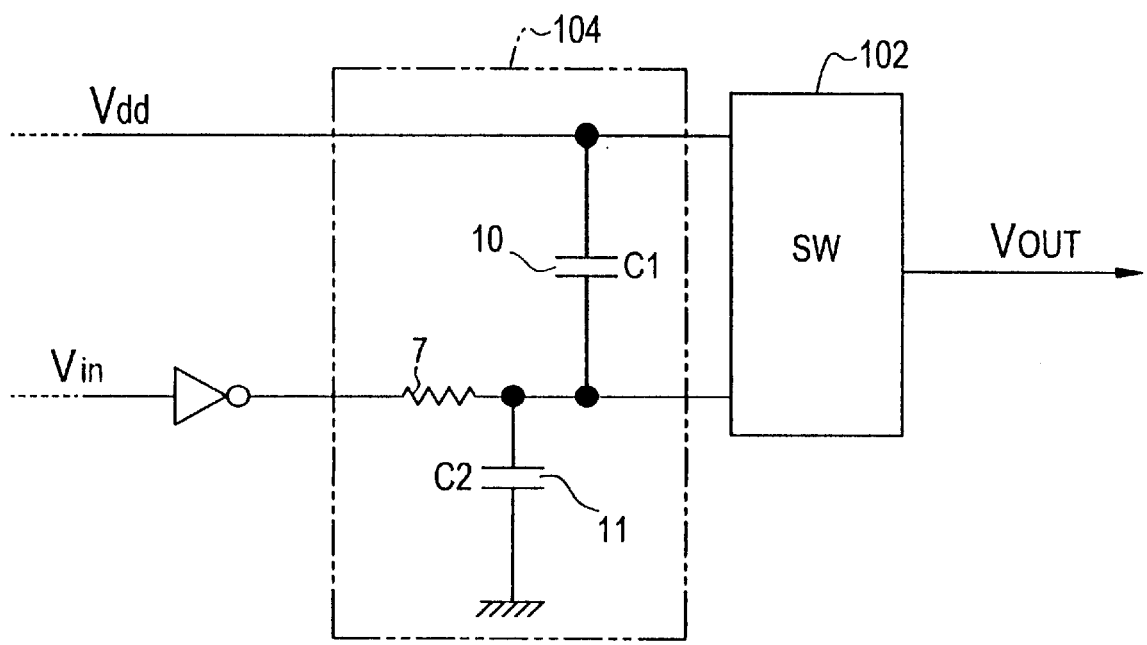
FIG. 2 is a circuit diagram depicting the structure of the integrating circuit and delay circuit pertaining to the present invention.

FIG. 2 is a circuit diagram depicting the structure of the integrating circuit and delay circuit pertaining to the present invention. The integrating circuit 104 comprises a resistor 7 for receiving a pulse signal, a first capacitor (C2) 11 connected in series to this resistor 7, and a second capacitor (C1) 10 in which one end is connected to the first capacitor 11 and the other end is connected to the power supply voltage Vdd corresponding to the high level of the aforementioned pulse signal, as shown in FIG. 2. The output V2 of the integrating circuit equipped with the second capacitor 10 is outputted while the noise component generated in the power supply Vdd is applied. For this reason, the noise component is absorbed and a malfunction is avoided when switching is performed in conjunction with the power supply voltage downstream from the integrating circuit 104. Specifically, the input voltage varies in accordance with the variations in the reference voltage when the power supply voltage and the input voltage are compared by a comparator or when an inverter or a NOT circuit is energized by a prescribed threshold value determined by the ratio of the power supply voltage. Incorrect switching is thus prevented.

In the integrating circuit 104 shown in FIG. 2, a delay circuit is formed by connecting a switch 102 energized by a prescribed threshold value determined by the ratio of the power supply voltage. This switch has an output terminal that is connected to the connection point of the first capacitor 11 and the aforementioned second capacitor 10. In addition, the switch 102 connects the aforementioned power supply to the output terminal when the signal received from the aforementioned connection point exceeds a predetermined threshold value, and disconnects the aforementioned power supply from the output terminal when the signal received from the aforementioned connection point falls below the predetermined threshold value. In an embodiment, this switch 102 is composed of an inverter or an NOT circuit energized by a prescribed threshold value. The signal inverted by the NOT circuit 101 is integrated by the integrating circuit 104. The switch 102 is energized when the output voltage of the integrating circuit 104 intersects the prescribed threshold value. The pulse signal is thus delayed by a delay time that corresponds to the time constant of the integrating circuit.

Figure 3:
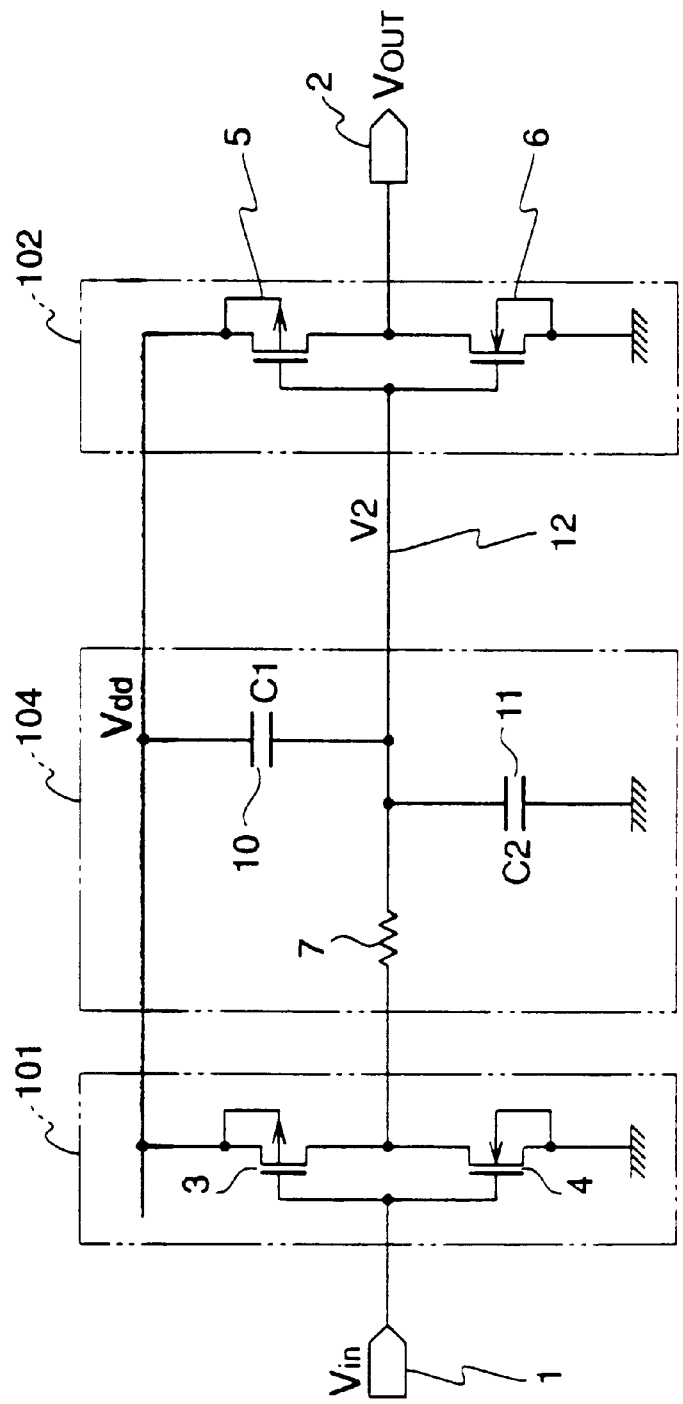
FIG. 3 is a circuit diagram depicting the structure of the digital circuit pertaining to the present invention.
Figure 7:
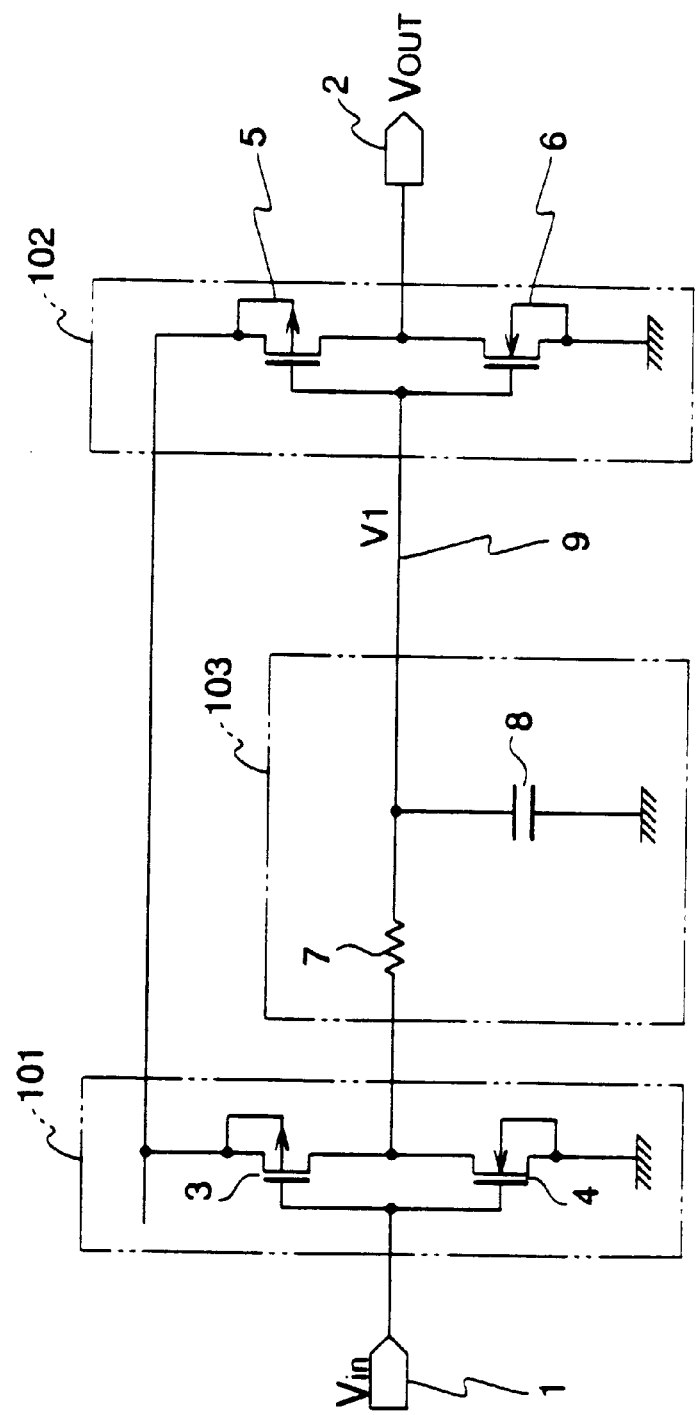
FIG. 7 is a circuit diagram depicting a conventional digital circuit.

FIG. 3 is a circuit diagram depicting an embodiment of the present invention. The structure of the inverters 101 and 102, the input terminal 1, and the output terminal 2 is the same as that of the conventional delay circuit depicted in FIG. 7.

An integrating circuit 104 comprises a resistor 7 and capacitors 10 and 11; the common connection point of the capacitors 10 and 11 is connected to the output terminal 12 of the integrating circuit 104; and the other electrodes of the capacitors 10 and 11 are connected to ground and to a power supply.

Figure 8:
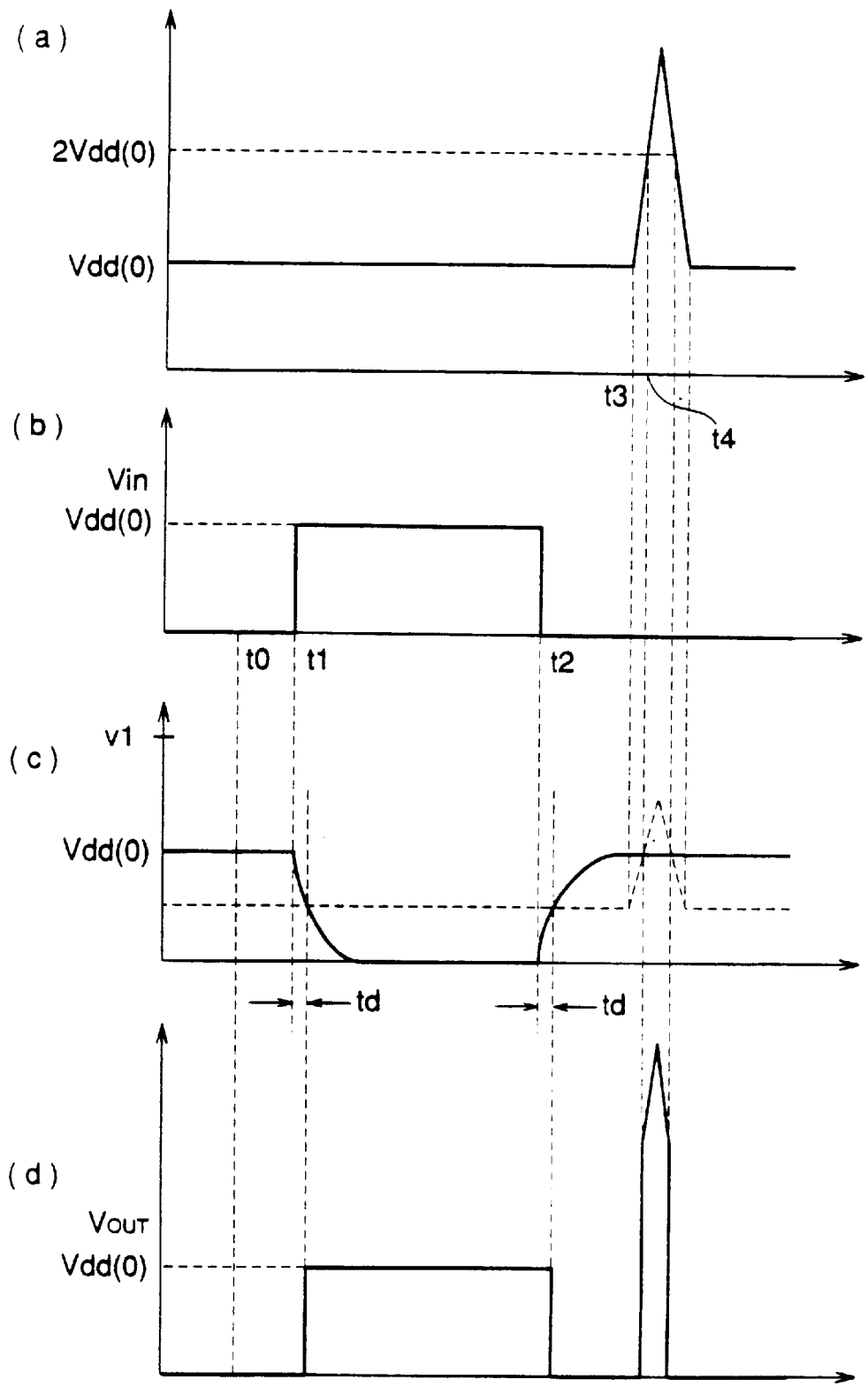
FIGS. 8a–8d are signal waveform diagrams illustrating the operation of the conventional digital circuit.

The operation of the delay circuit pertaining to this embodiment is basically the same as the operation of the conventional delay circuit depicted in FIG. 8. Specifically, an input signal Vin inputted to the input terminal 1 is inverted and outputted by an inverter 101. The inverted and outputted signal is integrated by the integrating circuit 104, and its waveform is smoothed. The waveform is shaped by inputting this signal to the inverter 102. The inverter 102 presents the output terminal 2 with an output signal Vout having the same phase as the input signal Vin, which is delayed by td in relation to the input signal.

The operation of the delay circuit shown in FIG. 3 will now be described in detail with reference to the signal waveform diagram depicted in FIG. 4.

If it is now assumed that the input signal Vin is at ground level at time t0 in FIG. 4b, the p-channel transistor 3 is on, and the integrating circuit 104 is charged by the power supply via the p-channel transistor 3. For this reason, the signal v2 of the output end 12 of the integrating circuit 104 assumes a power supply voltage Vdd(0), as shown in FIG. 4c. Consequently, the n-channel transistor 6 is switched on, and the output signal Vout reaches ground level, as shown in FIG. 4d. Here, SW is an equivalent representation of the inverter 101.

When the input signal Vin subsequently rises from ground level to the power supply voltage Vdd(0) at time t1 shown in FIG. 4b, the p-channel transistor 3 is switched off, and the n-channel transistor 4 is switched on. For this reason, the charge accumulated on the capacitor 10 is drained to ground via the resistor 7 and n-channel transistor 4. In the process, the charge accumulated on the capacitor 11 is drained at the same time.

Assuming that the "on" resistance of the n-channel transistor 4 is sufficiently low in relation to the resistance R of the resistor 7 and can thus be ignored, the time constant of the integrating circuit 104 can be calculated based on the equivalent circuit diagram of the integrating circuit 104 depicted in FIG. 5b.

In FIG. 5b, the following equations can be obtained.

$$i1=i2+i3 \tag{3}$$

$$V1+V2=Vdd \tag{4}$$

$$V2=R \cdot i3 \tag{5}$$

$$i1=C1 \cdot (dV1/dt) \tag{6}$$

$$i2=C2 \cdot (dV2/dt) \tag{7}$$

where i1 and i2 are the currents flowing through the capacitors 10 and 11, respectively; V1 and V2 are the voltages across the capacitors 10 and 11, respectively; Vdd is the power supply voltage; and i3 is the current flowing through the resistor 7.

The following equation can be obtained by deriving the output voltage V2 of the integrating circuit 104 from Equations 3–7.

$$V2=Vdd \cdot \exp(-t/(R \cdot (C1+C2))) \tag{8}$$

In addition, the time td' needed for the output voltage Vout to change from ground level to the power supply voltage Vdd(0) can be calculated using the following equation, which is similar to Equation 2.

$$td'=(C1+C2)R \cdot \ln 2 \tag{9}$$

where Vdd(0)/2 is the threshold value of the inverter 102.

Similarly, as shown in FIG. 4d, the output signal Vout decreases while lagging behind the input signal Vin by the delay time td calculated using Equation 9 when the input signal Vin drops from the power supply voltage Vdd(0) to ground level at time t2 shown in FIG. 4b. It is therefore possible to calculate, using Equation 9, the (C1+C2)R needed to obtain the necessary delay time td for the delay circuit shown in FIG. 3.

It can also be seen from Equation 9 that the time constant is determined by a sum of capacities C1 and C2 of the capacitors 10 and 11. The same delay value td' as the delay value td of a conventional delay circuit can therefore be achieved without increasing the surface area of the capacitors by dividing the capacity C of the capacitor 8, in which the time constant is determined by the conventional integrating circuit 103 depicted in FIG. 7, that is, by configuring the integrating circuit 104 such that C=C1+C2.

The operation of the delay circuit will now be described for a case in which noise is superposed on the power supply.

Let us assume that spike noise lasting several nanoseconds to several tens of nanoseconds is superposed on the power supply at time t3 in FIG. 4*a* in the same manner as in FIG. 8*a*. No current flows through the inverter 101 because the noise pulses are very narrow in the equivalent circuit of the integrating circuit 104 at this time. The equivalent circuit of the integrating circuit 104 can therefore be considered as one in which the SW in FIG. 5*a* is unconnected to the power supply or ground. Consequently, the output voltage V2 of the integrating circuit 104 can be approximated by the following equation.

$$V2=Vdd/(1+C2/C1) \quad (10)$$

where Vdd is the power supply voltage obtained by superposing noise on a constant power supply voltage Vdd(0).

On the other hand, the threshold value Vt of the inverter 102 is designed as Vdd/2. For this reason, the threshold value Vt of the inverter 102 and the V2 expressed by Equation 10 are as shown in FIG. 6. The graph indicated by symbol 20 refers to V2 and to Vt at C1=C2. Symbol 21 indicates Vt at C2/C1>1; symbol 22, V1 at C2/C1<1.

As shown in FIG. 6, the output voltage V2 of the integrating circuit 104 and the threshold value Vt of the inverter 102 are equal to each other when C2/C1=1, that is, when C1=C2. Consequently, the inverter 102 operates using the output voltage V2 of the integrating circuit 104 as a high level even when spike noise is superposed on the power supply. The result is that the inverter 102 is not inverted to the low level, and the delay circuit pertaining to the embodiment depicted in FIGS. 1 through 3 does not malfunction when noise is superposed on the power supply.

A method for determining the C2/C1 ratio of capacity C2 and capacity C1 will now be described for a case in which the threshold value Vt of the inverter 102 is equal to Vdd/a (where a is a constant of 1 or greater).

The output voltage V2 of the integrating circuit 104 is given by the following equation.

$$V2=Vdd \cdot C1/(C1+C2) \quad (11)$$

Assuming that the output voltage V2 and the threshold value Vt of the inverter 102 are equal to each other, the following can be obtained.

$$Vdd/a=Vdd \cdot C1/(C1+C2) \quad (12)$$

Based on this, the following is true.

$$C2/C1=a-1 \quad (13)$$

Specifically, the output voltage V2 of the integrating circuit 104 and the threshold value Vt of the inverter 102 are equal to each other, and no malfunctions are caused by the superposition of noise on ground and on the power supply when the threshold value Vt of the inverter 102 is equal to Vdd/a, and the ratio of capacity C2 and capacity C1 satisfies Equation 13.

The invention may be embodied in other specific forms without departing from the spirit or essential characteristic thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-023590 (Filed on Feb. 6, 1997) including specification, claims, drawings and summary are incorporated herein by reference in its entirety.

What is claimed is:

1. A delay circuit having an input terminal for receiving pulse signals and an output terminal for outputting delayed pulse signals, comprising:
   a first inverter for inverting a pulse signal received from the input terminal;
   an integrating circuit, having a resistor and a first capacitor, for integrating the pulse signal received from the first inverter;
   a second capacitor connected to a power supply voltage and the first capacitor; and
   a second inverter for inverting a signal outputted by the integrating circuit and the second capacitor when the signal has a voltage which is higher or lower than a predetermined threshold value;
   wherein a ratio of the capacitances of said first and second capacitors has a relationship with the predetermined threshold value, such that noise present in the power supply voltage does not affect operation of said second inverter;
   wherein the second inverter includes an n-channel CMOS transistor and a p-channel CMOS transistor;
   wherein said transistors are arranged so that the gates of the n-channel transistor and the p-channel transistor are connected to the first and second capacitors, respectively, the source of the p-channel transistor is connected to the power supply, and the drains of the transistors are connected to the output terminal;
   wherein the predetermined threshold value is a threshold value of the second inverter and has a value equal to P/a, where P is a power supply voltage and a is a constant of 1 or greater; and
   a capacity ratio C2/C1 of said second capacitor C1 and said first capacitor C2 equals a value a−1.

2. The delay circuit of claim 1 wherein a sum of capacitances of the first and second capacitors is set to equal C in order to establish a time constant of the integrating circuit, where C is a capacitance of a single capacitor for determining the time constant of the integrating circuit.

3. The delay circuit of claim 1 wherein the predetermined threshold value of the second inverter is ½ of the power supply voltage; and
   the ratio of the capacitances of said first capacitor and said second capacitor is 1:1.

* * * * *